United States Patent
Nagaoka et al.

(10) Patent No.: US 11,393,902 B2
(45) Date of Patent: Jul. 19, 2022

(54) SEMICONDUCTOR DEVICE

(71) Applicant: DENSO CORPORATION, Kariya (JP)

(72) Inventors: Tatsuji Nagaoka, Nagakute (JP); Yusuke Yamashita, Nagakute (JP); Yasushi Urakami, Kariya (JP)

(73) Assignee: DENSO CORPORATION, Kariya (JP)

( * ) Notice: Subject to any disclaimer, the term of this patent is extended or adjusted under 35 U.S.C. 154(b) by 357 days.

(21) Appl. No.: 16/487,007

(22) PCT Filed: Jan. 26, 2018

(86) PCT No.: PCT/JP2018/002487
§ 371 (c)(1),
(2) Date: Aug. 19, 2019

(87) PCT Pub. No.: WO2018/173477
PCT Pub. Date: Sep. 27, 2018

(65) Prior Publication Data
US 2020/0043823 A1 Feb. 6, 2020

(30) Foreign Application Priority Data

Mar. 22, 2017 (JP) .............................. JP2017-055344

(51) Int. Cl.
*H01L 29/10* (2006.01)
*H01L 23/34* (2006.01)
(Continued)

(52) U.S. Cl.
CPC .......... *H01L 29/1095* (2013.01); *H01L 23/34* (2013.01); *H01L 29/0696* (2013.01);
(Continued)

(58) Field of Classification Search
CPC .................. H01L 29/66333–66348; H01L 29/7395–7397; H01L 29/1095;
(Continued)

(56) References Cited

U.S. PATENT DOCUMENTS

| 9,379,224 B2* | 6/2016 | Soeno | H01L 29/7395 |
| 2010/0156506 A1* | 6/2010 | Tsuzuki | H03K 17/0828 |
| | | | 327/478 |
| 2017/0025524 A1 | 1/2017 | Kinoshita et al. | |

FOREIGN PATENT DOCUMENTS

| JP | 2011-134950 A | 7/2011 |
| JP | 2014-003095 A | 1/2014 |

(Continued)

OTHER PUBLICATIONS

Apr. 3, 2018 International Search Report issued in Internaitonal Patent Application No. PCT/JP2018/002487.

*Primary Examiner* — Shahed Ahmed
*Assistant Examiner* — Sun Mi Kim King
(74) *Attorney, Agent, or Firm* — Oliff PLC

(57) ABSTRACT

A semiconductor device includes a semiconductor substrate comprising an upper surface and a lower surface, an upper electrode provided on the upper surface, and a lower electrode provided on the lower surface. The semiconductor substrate includes, in a planar view, a first section including a center of the semiconductor substrate and a second section located between the first section and a peripheral edge of the semiconductor substrate. The first and second sections each comprise a MOSFET structure including a body diode. The MOSFET structure in the first section and the MOSFET structure in the second section are different from each other such that a forward voltage drop of the body diode in the first section with respect to a current density is higher than a forward voltage drop of the body diode in the second section with respect to the current density.

25 Claims, 8 Drawing Sheets

(51) Int. Cl.
*H01L 29/417* (2006.01)
*H01L 29/06* (2006.01)
*H01L 29/78* (2006.01)
*H01L 29/16* (2006.01)
*H01L 29/08* (2006.01)
*H01L 29/32* (2006.01)
*H01L 29/66* (2006.01)

(52) U.S. Cl.
CPC ...... *H01L 29/0865* (2013.01); *H01L 29/0882* (2013.01); *H01L 29/1608* (2013.01); *H01L 29/32* (2013.01); *H01L 29/41741* (2013.01); *H01L 29/66348* (2013.01); *H01L 29/7804* (2013.01); *H01L 29/7813* (2013.01)

(58) Field of Classification Search
CPC ........... H01L 29/0696; H01L 29/41741; H01L 29/66348; H01L 29/7813; H01L 29/7802
See application file for complete search history.

(56) References Cited

FOREIGN PATENT DOCUMENTS

| JP | 2014-132600 A | 7/2014 |
| JP | 2014-154849 A | 8/2014 |
| WO | 2016/039071 A1 | 3/2016 |

\* cited by examiner

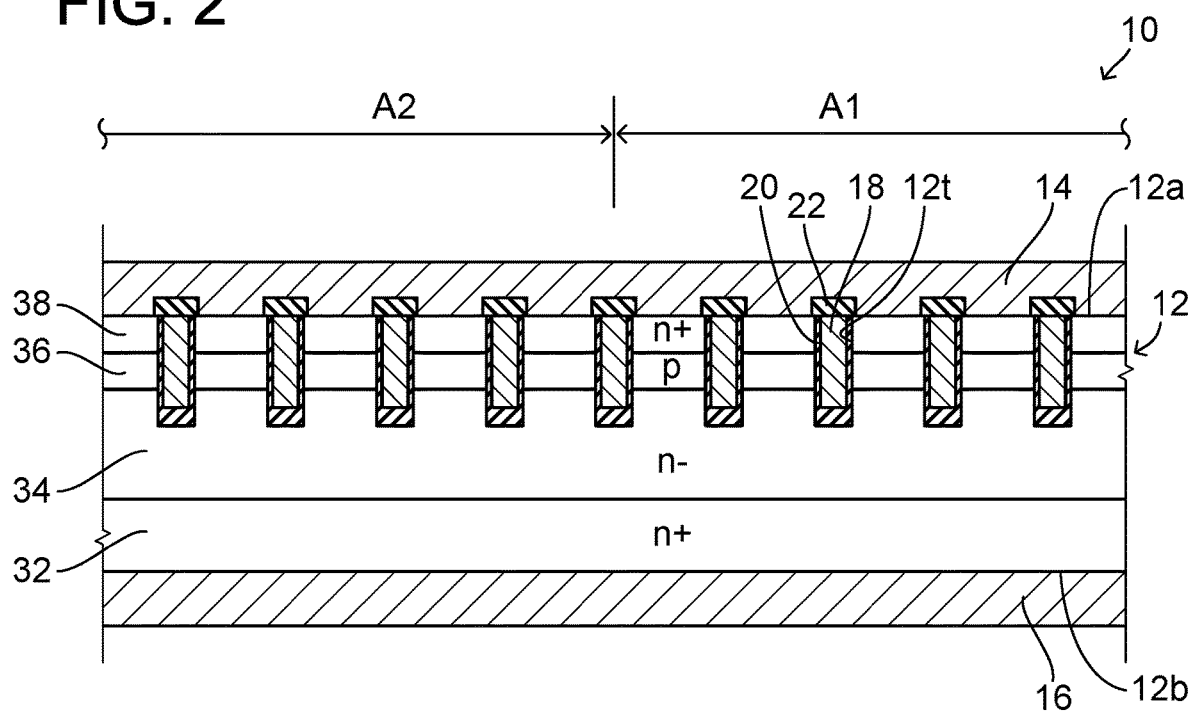
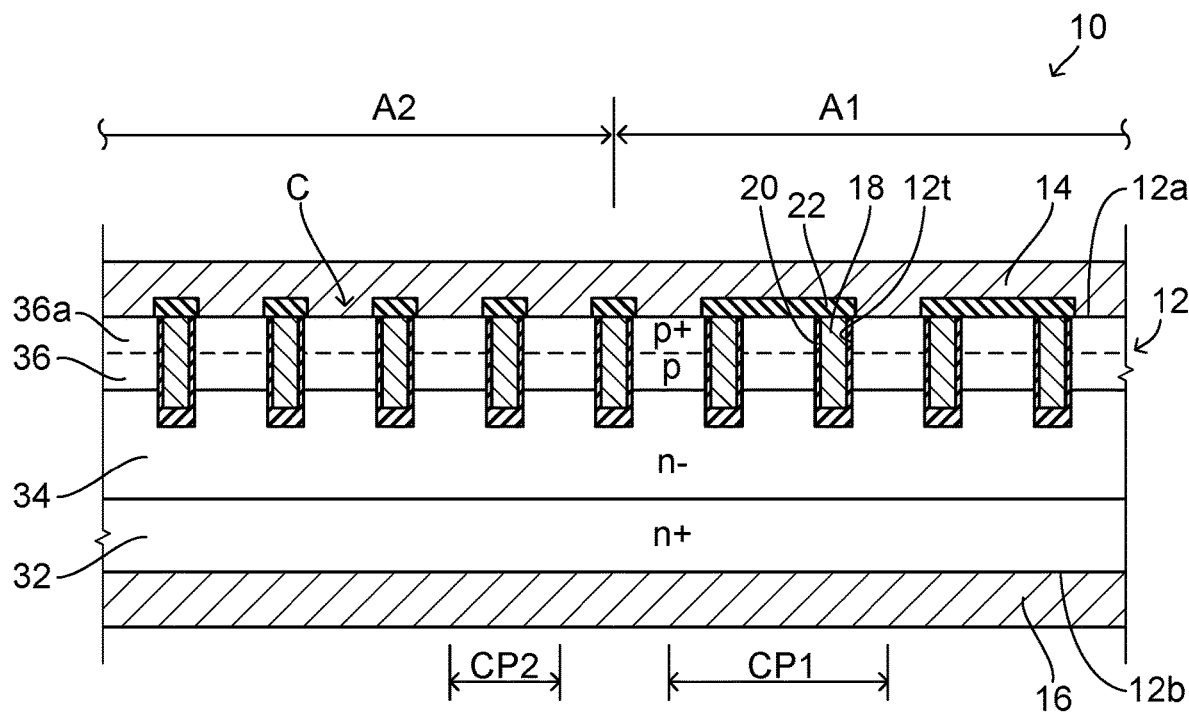

SEMICONDUCTOR DEVICE

TECHNICAL FIELD

A technology disclosed herein relates to a semiconductor device, and particularly relates to a technology for improving temperature distribution in a semiconductor device.

BACKGROUND ART

Japanese Patent Application Publication No. 2011-134950 describes a semiconductor device in which an IGBT (Insulated Gate Bipolar Transistor) and a freewheeling diode are integrally provided. A semiconductor device of this type is also referred to as an RC (Reverse Conducting)-IGBT, and has a structure in which collector regions of the IGBT and cathode regions of the freewheeling diode are alternately provided along a lower surface of a semiconductor substrate. In this semiconductor device, a ratio of the collector regions to the cathode regions is great in a central portion of the semiconductor substrate and is small in a peripheral edge portion of the semiconductor substrate. According to such a configuration, an amount of heat generated in the semiconductor substrate is reduced in the central portion which is inferior in heat dissipating property, and hence temperature distribution in the semiconductor device is improved (i.e., uniformized).

SUMMARY

As another semiconductor device that has a function similar to that of the RC-IGBT, a semiconductor device that has a MOSFET (Metal-Oxide-Semiconductor Field-Effect Transistor) structure including a body diode (which is also referred to as a parasitic diode) is known. In a semiconductor device of this type, the body diode in the MOSFET structure can function as a freewheeling diode. However, the body diode in the MOSFET structure generates a relatively large amount of heat, as a current flows. Therefore, using the body diode as a freewheeling diode is likely to make a temperature of the semiconductor substrate high and also make variations in temperature distribution large. The technology in the above Patent Literature is effective to improve temperature distribution, however, it cannot be applied to a semiconductor device that has a MOSFET structure because the technology utilizes the structure specific to an RC-IGBT.

Accordingly, the disclosure herein provides a technology for improving temperature distribution in a semiconductor device that has a MOSFET structure.

The technology disclosed herein specifies at least two sections having different degrees of heat dissipating property in a semiconductor substrate, and makes MOSFET structures (in particular, structures relating to body diodes) in these sections different from each other. Specifically, the MOSFET structures in these sections are designed such that a forward voltage drop of the body diode with respect to a current density in the section inferior in heat dissipating property is high and a forward voltage drop of the body diode with the same current density in the section superior in heat dissipating property is low. According to such a configuration, when a current flows in the body diode in each of the MOSFET structures, a current density becomes small in the section inferior in heat dissipating property and becomes large in the section superior in heat dissipating property. Consequently, in the plurality of sections having different degrees of heat dissipating property, temperature distribution is uniformized. It should be noted that the forward voltage drop of the body diode can be adjusted without affecting characteristics of the MOSFET, such as an on-voltage.

According to an aspect of the present technology, a semiconductor device as described below is disclosed. This semiconductor device may comprise a semiconductor substrate comprising an upper surface and a lower surface, an upper electrode provided on the upper surface of the semiconductor substrate, and a lower electrode provided on the lower surface of the semiconductor substrate. The semiconductor substrate may comprise, in a planar view, a first section including a center of the semiconductor substrate and a second section located between the first section and a peripheral edge of the semiconductor substrate. The first section and the second section may each comprise a MOSFET structure including a body diode. The MOSFET structure in the first section and the MOSFET structure in the second section may be different from each other such that a forward voltage drop of the body diode in the first section with respect to a current density may be higher than a forward voltage drop of the body diode in the second section with respect to the current density.

In the semiconductor device described above, the first section including the center of the semiconductor substrate is inferior in heat dissipating property to the second section located around the first section. Therefore, the MOSFET structure in the first section and the MOSFET structure in the second section are different from each other such that a current density of the body diode in the first section becomes smaller than a current density of the body diode in the second section. According to such a configuration, an amount of heat generated by the body diode is reduced in the first section, which is inferior in heat dissipating property, and hence temperature distribution in the semiconductor device is improved.

According to another aspect of the present technology, a semiconductor device as described below is also disclosed. This semiconductor device may comprise a semiconductor substrate comprising an upper surface and a lower surface, an upper electrode provided on the upper surface of the semiconductor substrate, a lower electrode provided on the lower surface of the semiconductor substrate, and an insulating protective film covering a part of the upper electrode. The semiconductor substrate may comprise, in a planar view, a first section covered by the protective film and a second section which is not covered by the protective film. The first section and the second section may each comprise a MOSFET structure including a body diode. The MOSFET structure in the first section and the MOSFET structure in the second section may be different from each other such that a forward voltage drop of the body diode in the first section with respect to a current density may be higher than a forward voltage drop of the body diode in the second section with respect to the current density.

In the semiconductor device described above, the protective film inhibits heat dissipation, and hence the first section covered by the protective film is inferior in heat dissipating property to the second section that is not covered by the protective film. Therefore, the MOSFET structure in the first section and the MOSFET structure in the second section are different from each other such that a current density of the body diode in the first section becomes smaller than a current density of the body diode in the second section. According to such a configuration, an amount of heat generated by the body diode is reduced in the first section, which is inferior in heat dissipating property, and hence the temperature distribution in the semiconductor device is improved.

According to still another aspect of the present technology, a semiconductor device as described below is further disclosed. This semiconductor device may comprise a semiconductor substrate comprising an upper surface and a lower surface, an upper electrode provided on the upper surface of the semiconductor substrate, a lower electrode provided on the lower surface of the semiconductor substrate, and an insulating protective film covering a part of the upper electrode. At least a part of an upper surface of the upper electrode may be configured to be joined with a conductive member, such as a lead. The semiconductor substrate may comprise, in a planar view, a first section which is not covered by the conductive member and a second section covered by the conductive member. The first section and the second section may each comprise a MOSFET structure including a body diode. The MOSFET structure in the first section and the MOSFET structure in the second section may be different from each other such that a forward voltage drop of the body diode in the first section with respect to a current density may be higher than a forward voltage drop of the body diode in the second section with respect to the current density.

In the semiconductor device described above, heat dissipation through the conductive member can be expected, and hence the first section that is not covered by the conductive member is inferior in heat dissipating property to the second section covered by the conductive member. Therefore, the MOSFET structure in the first section and the MOSFET structure in the second section are different from each other such that a current density of the body diode in the first section becomes smaller than a current density of the body diode in the second section. According to such a configuration, an amount of heat generated by the body diode is reduced in the first section, which is inferior in heat dissipating property, and hence the temperature distribution in the semiconductor device is improved.

BRIEF DESCRIPTION OF DRAWINGS

FIG. 2 is a cross-sectional view taken along a line II-II in FIG. 1, and schematically illustrates a cross-sectional structure of the semiconductor device 10 along source regions 38;

FIG. 3 is a cross-sectional view taken along a line III-III in FIG. 1, and schematically illustrates a cross-sectional structure of the semiconductor device 10 along body contact regions 36a, where an interval CP1 of adjacent body contact areas C in a section A1 and an interval CP2 of adjacent body contact areas C in a section A2 are different from each other;

FIG. 8 is a cross-sectional view taken along a line VIII-VIII in FIG. 6, and schematically illustrates a cross-sectional structure of the semiconductor device 100 along the body contact regions 36a;

FIG. 13 is a cross-sectional view taken along a line XIII-XIII in FIG. 11, and schematically illustrates a cross-sectional structure of the semiconductor device 120 along the body contact regions 36a.

DESCRIPTION OF EMBODIMENTS

Figure 1:
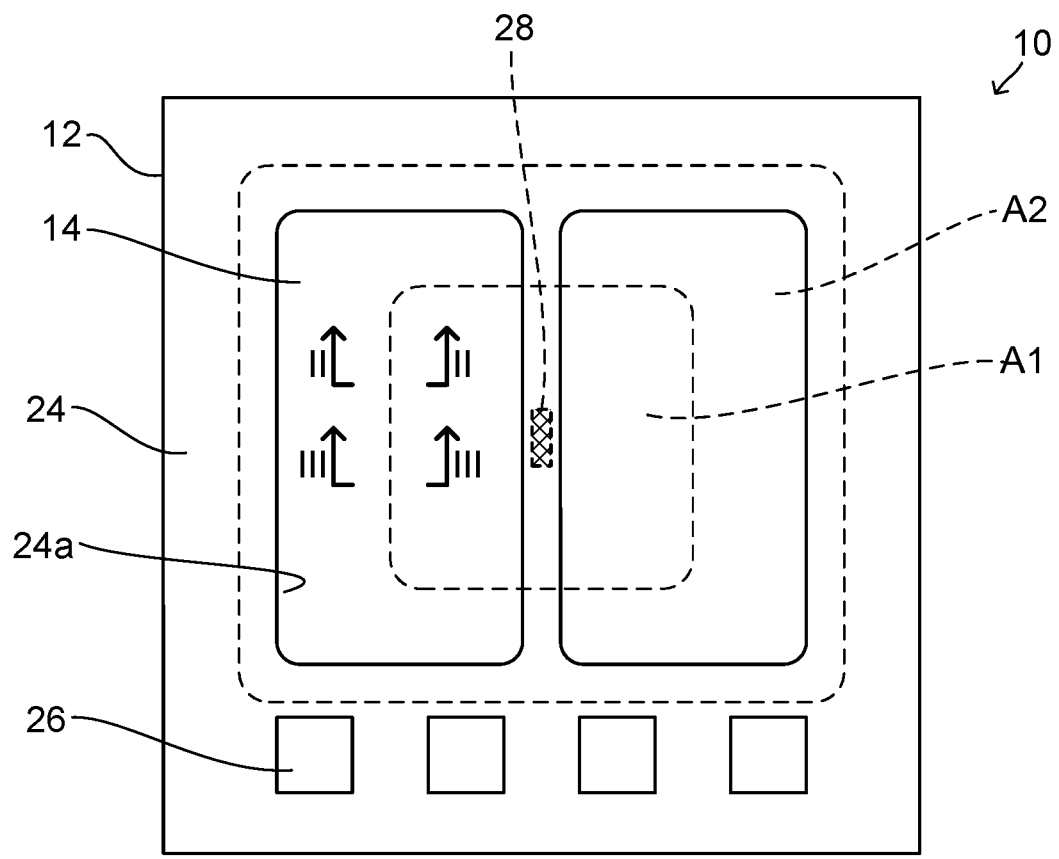
FIG. 1 is a planar view of a semiconductor device 10 in a first embodiment.

In an embodiment of the present technology, each of the MOSFET structures may include an n-type source region being in contact with the upper electrode, an n-type drain region being in contact with the lower electrode, a p-type body region intervening between the source region and the drain region and being in contact with the upper electrode, and an n-type drift region intervening between the body region and the drain region. According to such a configuration, in each of the MOSFET structures, a body diode that allows a current to flow from the upper electrode to the lower electrode is configured by a pn junction between the body region and the drift region. In another embodiment, however, each of the MOSFET structures may have a structure different from the above-described structure.

In an embodiment of the present technology, an occupancy of a contact area where the body region is in contact with the upper electrode in the first region may be smaller than an occupancy of a contact area where the body region is in contact with the upper electrode in the second region. According to such a configuration, the forward voltage drop of the body diode in the first section with respect to a current density can be made higher than the forward voltage drop of the body diode in the second section with respect to the same current density, without changing characteristics as the MOSFETs.

As an aspect of the above-described structure, the first section and the second section each may include a plurality of contact areas where the body region is in contact with the upper electrode. In this case, an interval of the contact areas in the first section may be greater than an interval of the contact areas in the second section. Additionally or alternatively, a size of each contact area in the first section may be smaller than a size of each contact area in the second section.

In an embodiment of the present technology, a concentration of p-type impurities of the body region at a portion located below a contact area where the body region is in contact with the upper electrode in the first section may be smaller than a concentration of p-type impurities of the body region at a portion located below a contact area where the body region is in contact with the upper electrode in the second section. With such a structure as well, the forward voltage drop of the body diode in the first section with respect to a current density can be made higher than the forward voltage drop of the body diode in the second section with respect to the same current density, without changing the characteristics as the MOSFETs.

In an embodiment of the present technology, a density of crystal defects at a portion located below a contact area where the body region is in contact with the upper electrode in the first section may be greater than a density of crystal defects at a portion located below a contact area where the body region is in contact with the upper electrode in the second section. With such a structure as well, the forward voltage drop of the body diode in the first section with respect to a current density can be made higher than the forward voltage drop of the body diode in the second section with respect to the same current density, without changing the characteristics as the MOSFETs.

In the above-described embodiment, a density of crystal defects at a portion of the drift region located below the contact area in the first section may be greater than a density of crystal defects at a portion of the drift region located below the contact area in the second section. In other words, the above-mentioned differentiation between the densities of crystal defects may take place in the drift region, as an example.

In an embodiment of the present technology, the semiconductor device may further comprise a temperature sensor configured to measure a temperature of the semiconductor substrate. In this case, in a planar view, the temperature sensor may be located at or close to a (the) center of the semiconductor substrate. However, a position at which the temperature sensor is located can be changed variously. Since the temperature distribution in the semiconductor substrate is improved according to the present technology, the temperature of the semiconductor substrate can be measured accurately irrespective of a position of the temperature sensor.

Representative, non-limiting examples of the present disclosure will now be described in further detail with reference to the attached drawings. This detailed description is merely intended to teach a person of skill in the art further details for practicing preferred aspects of the present teachings and is not intended to limit the scope of the present disclosure. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

(First Embodiment) With reference to the drawings, a semiconductor device 10 in a first embodiment will be described. The semiconductor device 10 in the present embodiment is a power semiconductor device used for a power supplying circuit. As described below, the semiconductor device 10 comprises a MOSFET structure including a body diode (which is also referred to as a parasitic diode), and can be adopted as a switching element of, for example, a converter or an inverter.

As shown in FIGS. 1 to 3, the semiconductor device 10 includes a semiconductor substrate 12. The semiconductor substrate 12 includes an upper surface 12a and a lower surface 12b located opposite to the upper surface 12a. It should be noted that the terms "the upper surface" and "the lower surface" used herein are expressions for conveniently distinguishing two surfaces located opposite to each other, and do not limit an orientation of the semiconductor device 10 in manufacture or in use. Moreover, the term "below" in the present disclosure means a direction from the upper surface 12a to the lower surface 12b of the semiconductor substrate 12. The semiconductor substrate 12 in the present embodiment is a substrate of silicon carbide (SiC). However, a semiconductor material that constitutes the semiconductor substrate 12 is not particularly limited, and may be, for example, silicon (Si) or a compound semiconductor such as gallium nitride (GaN). Here, as compared to silicon, wide-band-gap semiconductors such as silicon carbide and gallium nitride are characterized in that a forward voltage drop of a pn junction diode is high. Therefore, the technology disclosed herein can be much highly effective in a case where the semiconductor substrate 12 is a substrate of a wide-band-gap semiconductor.

The semiconductor device 10 further includes an upper electrode 14 provided on the upper surface 12a of the semiconductor substrate 12 and a lower electrode 16 provided on the lower surface 12b of the semiconductor substrate 12. Each of the upper electrode 14 and the lower electrode 16 is a conductive member. The upper electrode 14 is in ohmic contact with the upper surface 12a of the semiconductor substrate 12, and the lower electrode 16 is in ohmic contact with the lower surface 12b of the semiconductor substrate 12. Each of the upper electrode 14 and the lower electrode 16 can be constituted of a metal material such as aluminum (Al), nickel (Ni), titanium (Ti), or gold (Au). No particular limitation is placed on materials and structures of the upper electrode 14 and the lower electrode 16.

In the upper surface 12a of the semiconductor substrate 12, a plurality of trenches 12t is provided. The plurality of trenches 12t is parallel to one another and extends along an up-down direction in FIG. 1. In other words, FIGS. 2 and 3 each illustrate a cross section vertical to the plurality of trenches 12t. In each of the trenches 12t, a gate electrode 18 and a gate insulating film 20 are provided. The gate electrodes 18 are constituted of a conductive material such as polysilicon, and the gate insulating films 20 are constituted of an insulating material such as silicon oxide ($SiO_2$). Each of the gate electrodes 18 is opposed to the semiconductor substrate 12 with the corresponding gate insulating film 20 interposed therebetween. Between the gate electrodes 18 and the upper electrode 14, interlayer insulating films 22 are provided. The interlayer insulating films 22 are constituted of an insulating material such as silicon oxide ($SiO_2$), and electrically insulate the gate electrodes 18 and the upper electrode 14 from each other.

On an upper surface 12a side of the semiconductor substrate 12, a protective film 24 is provided. The protective film 24 is constituted of an insulating material such as polyimide. The protective film 24 is located on the upper electrode 14 and covers a part of the upper electrode 14. The protective film 24 mainly covers a peripheral part of the upper electrode 14 and has two openings 24a provided in its central part, through which the upper electrode 14 is exposed. A cross-sectional structure of the protective film 24 is illustrated in, for example, FIGS. 7 and 8. No particular limitation is placed on structures of the protective film 24 and the openings 24a, such as their positions, sizes, shapes, and numbers.

Additionally, on the upper surface 12a side of the semiconductor substrate 12, a plurality of signal electrodes 26 and a temperature sensor 28 are provided. The gate electrodes 18, the upper electrode 14, and the temperature sensor 28 are electrically connected to the plurality of signal electrodes 26, for example. The temperature sensor 28 is located at (or close to) a center of the semiconductor substrate 12. The temperature sensor 28 is a sensor that measures a temperature of the semiconductor substrate 12 and outputs an electric signal corresponding to the temperature. Usually, an operation of the semiconductor device 10 is controlled in accordance with a measured temperature by the temperature sensor 28. For example, when the measured temperature by the temperature sensor 28 exceeds an upper limit, control for interrupting a current that flows in the semiconductor substrate 12 is performed.

The semiconductor substrate 12 includes a drain region 32, a drift region 34, a body region 36, and source regions 38. The drain region 32 is an n-type semiconductor region. The drain region 32 is located along the lower surface 12b of the semiconductor substrate 12 and is disposed at the lower surface 12b. The drain region 32 expands over an entirety of the semiconductor substrate 12 in the form of a layer. The lower electrode 16, which is described above, is in ohmic contact with the drain region 32.

The drift region 34 is an n-type semiconductor region. A concentration of n-type impurities of the drift region 34 is smaller than a concentration of n-type impurities of the drain region 32. The drift region 34 is located on the drain region 32 and is in contact with the drain region 32. The drift region 34 expands over the entirety of the semiconductor substrate 12 in the form of a layer. The concentration of n-type impurities of the drift region 34 may be constant along a thickness direction of the semiconductor substrate 12 or may vary continuously or in stages along the thickness direction. Moreover, in the drift region 34, p-type semiconductor regions (so-called floating regions) may be provided along bottom surfaces of the trenches 12t, for example.

The body region 36 is a p-type semiconductor region. The body region 36 is located on the drift region 34 and is in contact with the drift region 34. The body region 36 expands over the entirety of the semiconductor substrate 12 in the form of a layer. The body region 36 includes body contact regions 36a disposed at the upper surface 12a of the semiconductor substrate 12. A concentration of p-type impurities of the body contact regions 36a is greater than a concentration of p-type impurities of another part of the body region 36. Thereby, the upper electrode 14, which is described above, is in ohmic contact with the body contact regions 36a. In the upper surface 12a of the semiconductor substrate 12, the plurality of body contact regions 36a and the plurality of source regions 38 are provided in stripes. In other words, in the upper surface 12a of the semiconductor substrate 12, the body contact regions 36a and the source regions 38 are alternately provided along a longitudinal direction of the trenches 12t (the up-down direction in FIG. 1), and each of the body contact regions 36a and each of the source regions 38 extend vertically to the longitudinal direction of the trenches 12t (see FIGS. 2 and 3).

The source regions 38 are n-type semiconductor regions. A concentration of n-type impurities of the source regions 38 is greater than the concentration of n-type impurities of the drift region 34. The source regions 38 are located on the body region 36 and are disposed at the upper surface 12a of the semiconductor substrate 12. The upper electrode 14, which is described above, is also in ohmic contact with the source regions 38. The source regions 38 are separated from the drift region 34 and the drain region 32, which are of the same n-type, with the body region 36 interposed therebetween.

The trenches 12t extend from the upper surface 12a of the semiconductor substrate 12 to the drift region 34 through the body region 36. The gate electrodes 18 are opposed to the source regions 38, the body region 36, and the drift region 34 with the gate insulating films 20 interposed therebetween. When a voltage positive with respect to that of the upper electrode 14 (so-called a gate drive voltage) is applied to the gate electrodes 18, inversion layers (so-called channels) are thereby formed in portions of the body region 36 that are opposed to the gate electrodes 18. The source regions 38 and the drift region 34 are electrically connected, and electrical conduction is established between the upper electrode 14 and the lower electrode 16.

As described above, the semiconductor substrate 12 includes a MOSFET structure that includes the drain region 32, the drift region 34, the body region 36, and the source regions 38. As specifically shown in FIG. 3, this MOSFET structure includes a body diode (which is also referred to as a parasitic diode). In other words, between the upper electrode 14 and the lower electrode 16, a pn junction-type diode is provided by a p-type semiconductor layer that is the body region 36 (which includes the body contact regions 36a) and an n-type semiconductor layer that includes the drift region 34 and the drain region 32. This body diode allows a current that flows from the upper electrode 14 to the lower electrode 16, but interrupts a current that flows from the lower electrode 16 to the upper electrode 14. Therefore, when the semiconductor device 10 is adopted as a switching element of a converter or an inverter, the body diode in the semiconductor device 10 can be utilized as a freewheeling diode. Accordingly, a separate diode element is not necessarily required.

However, a body diode in a MOSFET structure generates a relatively large amount of heat, when a current flows. Therefore, when the body diode is utilized as a freewheeling diode, a temperature of the semiconductor substrate 12 tends to become high, and variations in the temperature distribution tends to be large. As described above, the temperature of the semiconductor substrate 12 is monitored by the temperature sensor 28, and the operation of the semiconductor device 10 is controlled based on the temperature measured by the temperature sensor 28. In this regard, if the temperature distribution in the semiconductor substrate 12 varies, reliability of the temperature measured by the temperature sensor 28 is decreased. In other words, even though the operation of the semiconductor device 10 is controlled based on the temperature measured by the temperature sensor 28, a failure due to overheating of the semiconductor substrate 12 may be unavoidable. As such, in the semiconductor device 10, it is important to improve the temperature distribution in the semiconductor substrate 12. For this purpose, the semiconductor device 10 in the present embodiment adopts a structure as described below.

As shown in FIGS. 1 to 3, the semiconductor substrate 12 includes, in a planar view, a section A1 including the center of the semiconductor substrate 12 and a section A2 located between the section A1 and a peripheral edge of the semiconductor substrate 12. The two sections A1 and A2 each include a MOSFET structure including the body diode described above. As shown in FIG. 2, the two sections A1 and A2 are the same in their structures relating to an operation of the MOSFETs among the MOSFET structures. On the other hand, as shown in FIG. 3, the two sections A1 and A2 are different from each other in their structures relating to the body diodes among the MOSFET structures. This is intended to make a forward voltage drop of the body diode in the section A1 with respect to a current density higher than a forward voltage drop of the body diode in the section A2 with respect to the same current density.

According to such a configuration, when a current flows in the body diodes in the semiconductor substrate 12, a current density in the section A1 becomes smaller than a current density in the section A2. Consequently, an amount of heat generated per unit area in the section A1 is reduced as compared to an amount of heat generated per unit area in the section A2. The section A1 including the center of the semiconductor substrate 12 is inferior in heat dissipating property to the section A2 located around the section A1. In other words, the semiconductor device 10 in the present embodiment is configured such that an amount of heat generated in the semiconductor substrate 12 is reduced in the section A1, which is inferior in heat dissipating property. This improves the temperature distribution in the semiconductor substrate 12 and enhances reliability of the temperature measured by the temperature sensor 28. In other words, by improving the temperature distribution in the semiconductor substrate 12, the temperature of the semiconductor substrate 12 can be accurately measured, irrespective of a position at which the temperature sensor 28 is located.

A means for differentiating the forward voltage drops of the body diodes with respect to the same current density between the two sections A1 and A2 is not limited to a specific means. For example, as shown in FIG. 3, the two sections A1 and A2 each include a plurality of body contact areas C where the body region 36 is in contact with the upper electrode 14. In such a structure, it is considered to make an interval CP1 of the body contact areas C in the section A1, which is inferior in heat dissipating property, greater than an interval CP2 of the body contact areas C in the other section A2. This makes an occupancy of the areas where the body region 36 is in contact with the upper electrode 14 (i.e., an occupancy of the body contact areas C) smaller in the section A1 than in the section A2. Consequently, the forward voltage drop of the body diode in the section A1 with respect to a current density becomes higher than the forward voltage drop of the body diode in the section A2 with respect to the same current density, and hence the temperature distribution in the semiconductor substrate 12 can be improved. Here, since the structure relating to the operation of the MOSFET is not affected (see FIG. 2), characteristics of the semiconductor device 10 as the MOSFET are maintained as they are.

Figure 4:
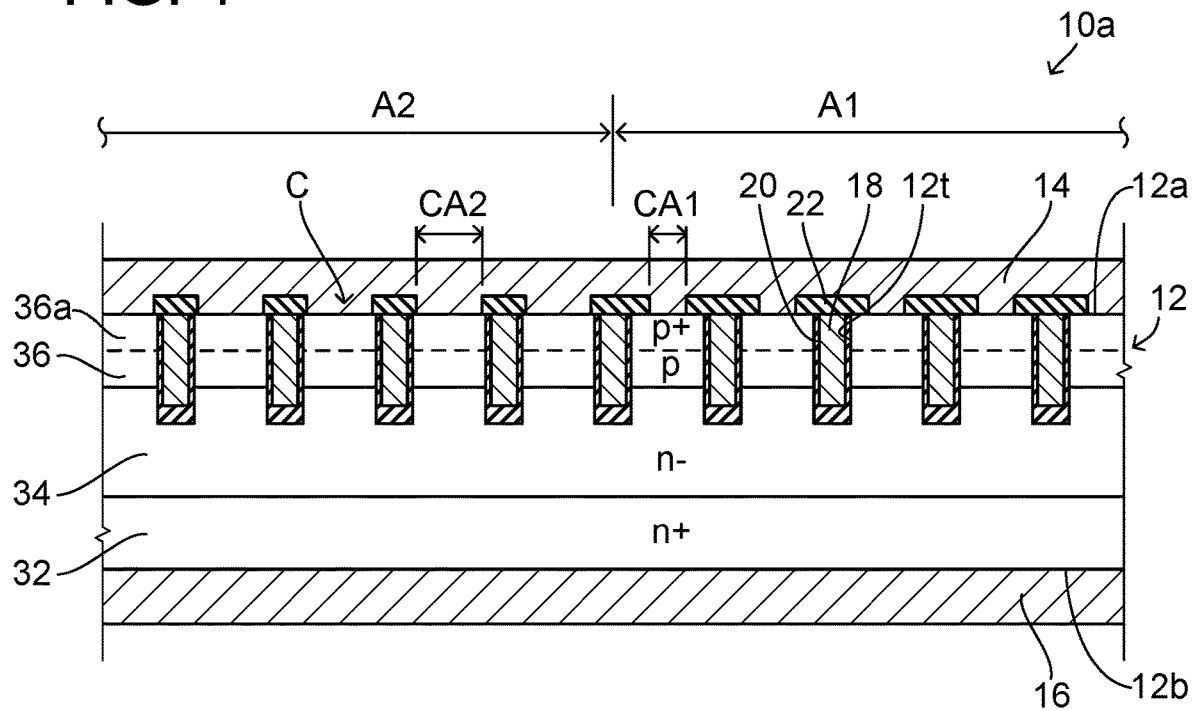
FIG. 4 illustrates a semiconductor device 10a, which is a variant of the first embodiment, where in this semiconductor device 10a, a size CA1 of each body contact area C in the section A1 and a size CA2 of each body contact area C in the section A2 are different from each other.

Alternatively, as shown in FIG. 4, a size CA1 of each body contact area C in the section A1, which is inferior in heat dissipating property, may be made smaller than a size CA2 of each body contact area C in the other section A2. With such a structure as well, the occupancy of the areas where the body region 36 is in contact with the upper electrode 14 (i.e., the occupancy of the body contact areas C) becomes smaller in the section A1 than in the section A2. Consequently, the forward voltage drop of the body diode in the section A1 with respect to a current density becomes higher than the forward voltage drop of the body diode in the section A2 with respect to the current density, and hence the temperature distribution in the semiconductor substrate 12 can be improved.

Figure 5:
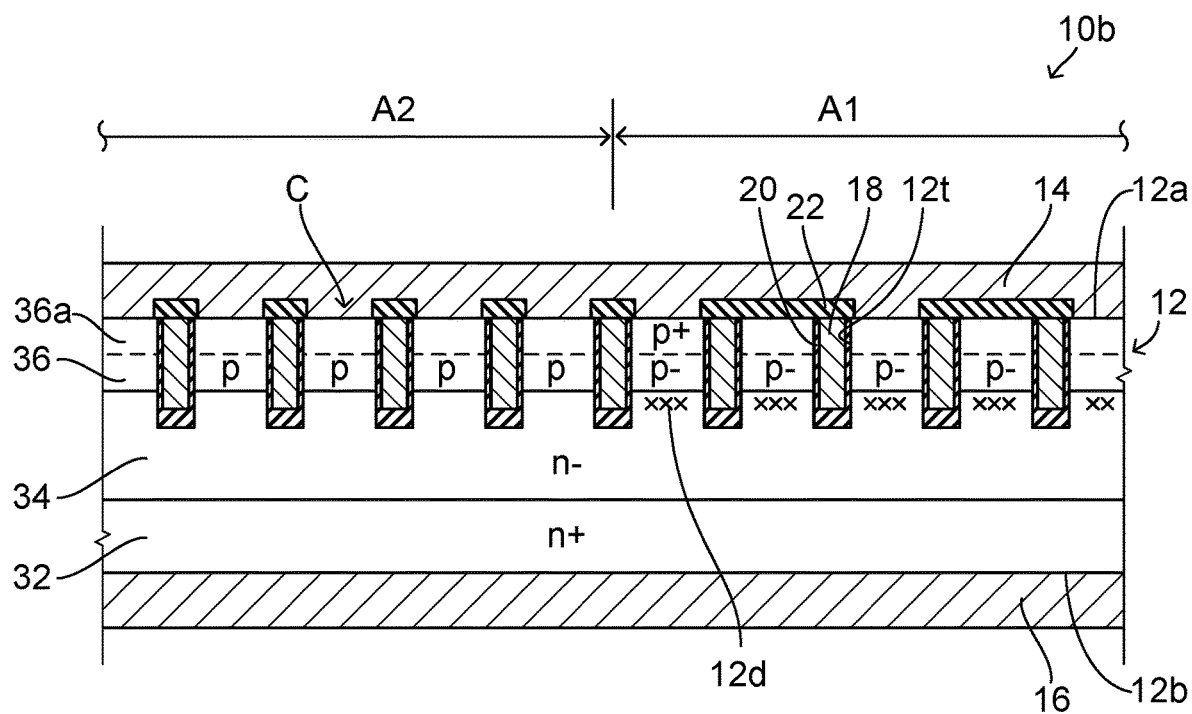
FIG. 5 illustrates a semiconductor device 10b, which is another variant of the first embodiment, where in this semiconductor device 10b, a concentration of p-type impurities of a body region 36 at portions thereof located below the body contact areas C in the section A1 and a concentration of p-type impurities of the body region 36 at portion thereof located below the body contact areas C in the section A2 are different from each other, and additionally, a density (or concentration) of crystal defects 12d at portions located below the body contact areas C in the section A1 and a density of crystal defects 12d at portions located below the body contact areas C in the section A2 are different from each other.

Alternatively, as shown in FIG. 5, the concentration of p-type impurities of the body region 36 at portions thereof located below the body contact areas C in the section A1, which is inferior in heat dissipating property, may be made smaller than the concentration of p-type impurities of the body region 36 at portions thereof located below the body contact areas C in the other section A2. With such a structure as well, the forward voltage drop of the body diode in the section A1 with respect to a current density can be made higher than the forward voltage drop of the body diode in the section A2 with respect to the same current density, without changing the characteristics as the MOSFET. Additionally or alternatively, as shown also in FIG. 5, a density of crystal defects 12*d* at portions located below the body contact areas C in the section A1, which is inferior in heat dissipating property, may be made greater than a density of crystal defects (not shown) at portions located below the body contact areas C in the other section A2. With such a structure as well, the forward voltage drop of the body diode in the section A1 with respect to a current density can be made higher than the forward voltage drop of the body diode in the section A2 with respect to the same current density, without changing the characteristics as the MOSFET. As an example, in order to differentiate the density of the crystal defects 12*d* between the two sections A1 and A2, the crystal defects 12*d* can be provided intentionally in the drift region 34 in the section A1, which is inferior in heat dissipating property.

Some of the structural examples shown in FIGS. 3 to 5 can be adopted solely, or two or more of them can be adopted in arbitrary combinations.

Figure 6:
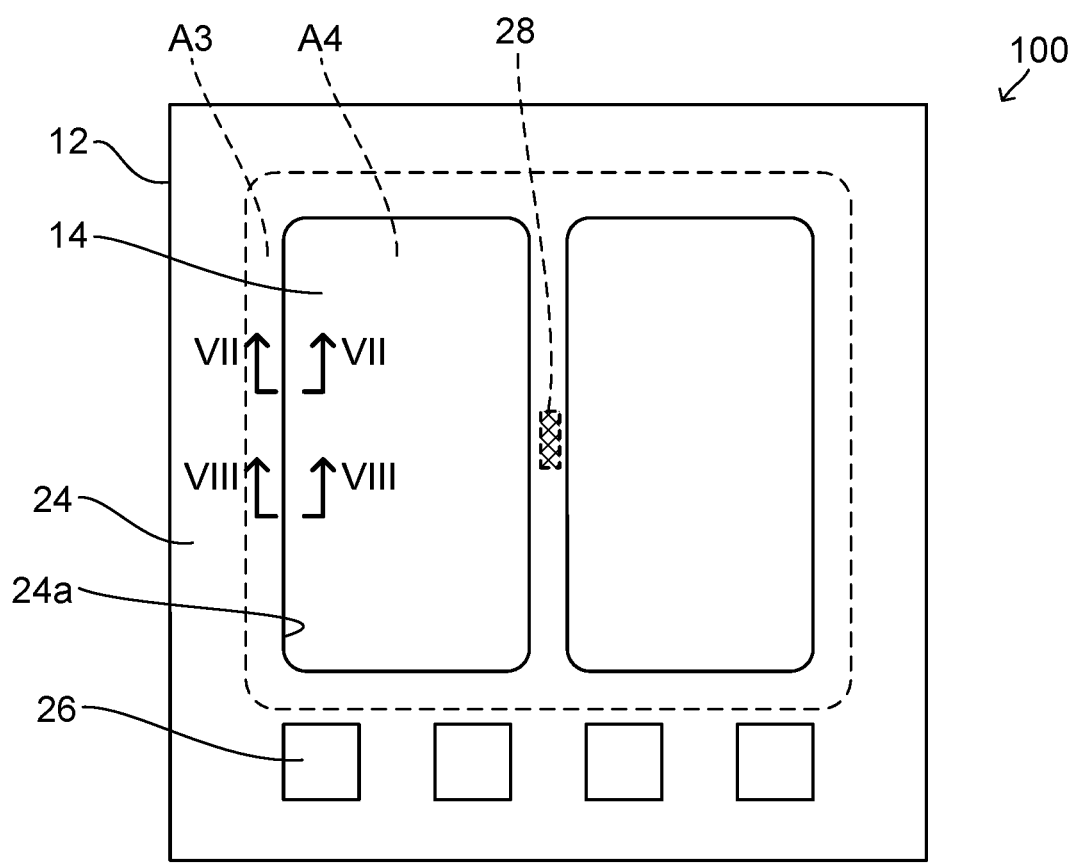
FIG. 6 is a planar view of a semiconductor device 100 in a second embodiment.
Figure 7:
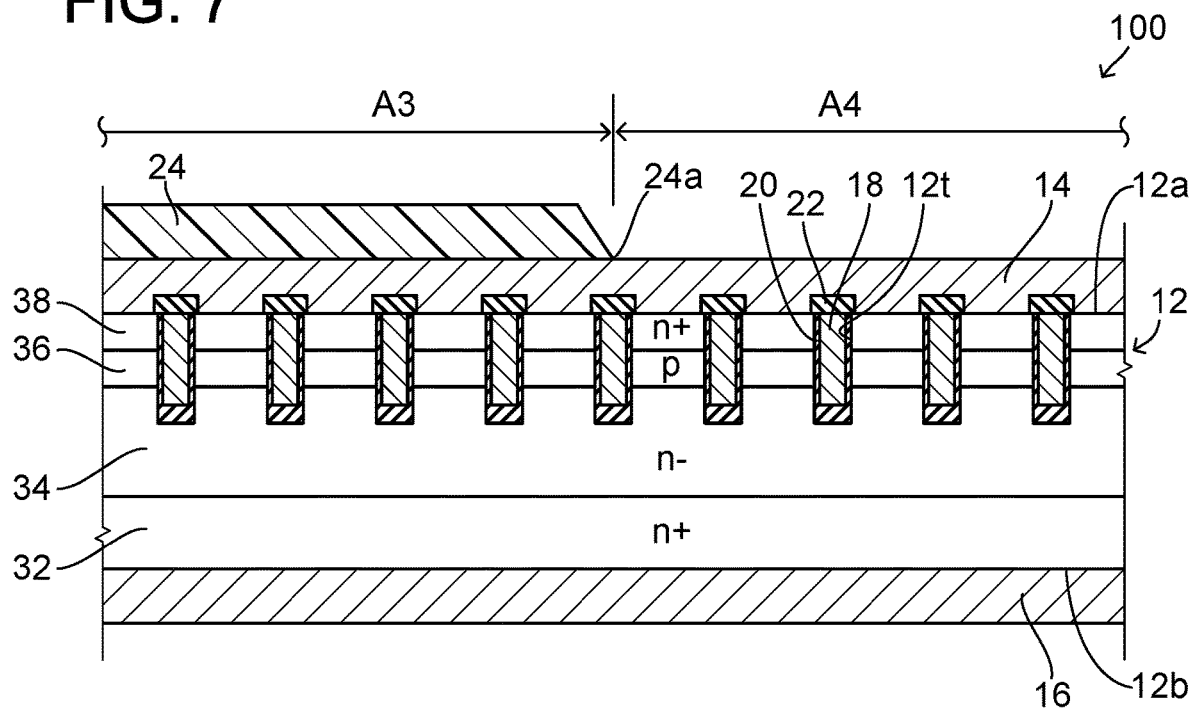
FIG. 7 is a cross-sectional view taken along a line VII-VII in FIG. 6, and schematically illustrates a cross-sectional structure of the semiconductor device 100 along the source regions 38.
Figure 8:
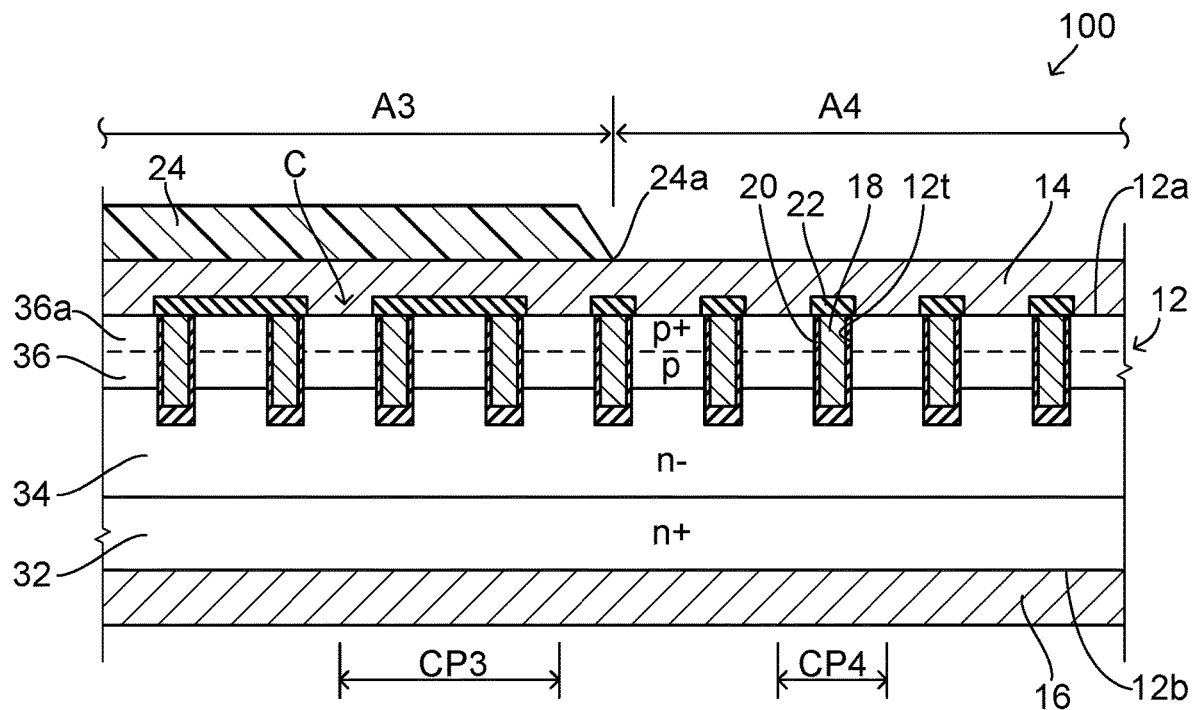

(Second Embodiment) Next, with reference to FIGS. 6 to 8, a semiconductor device 100 in a second embodiment will be described. Configurations that are common with or correspond to configurations in the first embodiment are denoted with the same signs, and overlapping descriptions for them are omitted here. As shown in FIGS. 6 to 8, the semiconductor substrate 12 includes, in a planar view, a section A3 covered by the protective film 24 and a section A4 that is not covered by the protective film 24. The two sections A3 and A4 each include the MOSFET structure including the body diode described in the first embodiment.

In the semiconductor device 100 in the present embodiment, the MOSFET structure in the section A3 covered by the protective film 24 and the MOSFET structure in the section A4 that is not covered by the protective film 24 are different from each other. In this regard, the semiconductor device 100 in the present embodiment is different from the semiconductor devices 10, 10*a*, and 10*b* described in the first embodiment. As shown in FIG. 7, the two sections A3 and A4 are the same in their structures relating to an operation of the MOSFETs among the MOSFET structures. On the other hand, as shown in FIG. 8, the two sections A3 and A4 are different from each other in their structures relating to the body diodes. This is intended make a forward voltage drop of the body diode in the section A3 with respect to a current density higher than a forward voltage drop of the body diode in the section A4 with respect to the same current density.

According to such a configuration, when a current flows in the body diodes in the semiconductor substrate 12, a current density in the section A3 becomes smaller than a current density in the section A4. Consequently, an amount of heat generated per unit area in the section A3 is reduced as compared to an amount of heat generated per unit area in the section A4. The section A3 covered by the protective film 24 is inferior in heat dissipating property to the section A4 that is not covered by the protective film 24. In other words, the semiconductor device 100 in the present embodiment is configured such that the amount of heat generated in the semiconductor substrate 12 is reduced in the section A3, which is inferior in heat dissipating property. This improves the temperature distribution in the semiconductor substrate 12 and enhances reliability of the temperature measured by the temperature sensor 28. In other words, by improving the temperature distribution in the semiconductor substrate 12, the temperature of the semiconductor substrate 12 can be accurately measured, irrespective of a position at which the temperature sensor 28 is located.

As in the first embodiment, a means for differentiating the forward voltage drops of the body diodes with respect to a current density between the section A3 and A4 is not limited to a specific means. For example, as shown in FIG. 8, the two sections A3 and A4 each include a plurality of the body contact areas C where the body region 36 is in contact with the upper electrode 14. In such a structure, it is considered to make a size CA3 of each body contact area C in the section A3, which is inferior in heat dissipating property, smaller than a size CA4 of each body contact area C in the other section A4. An occupancy of the areas where the body region 36 is in contact with the upper electrode 14 (i.e., an occupancy of the body contact areas C) in the section A3 thereby becomes smaller than an occupancy of the areas where the body region 36 is in contact with the upper electrode 14 in the section A4. Consequently, the forward voltage drop of the body diode in the section A3 with respect to a current density becomes higher than the forward voltage drop of the body diode in the section A4 with respect to the current density, and hence the temperature distribution in the semiconductor substrate 12 can be improved. Here, since the structure relating to the operation of the MOSFET is not affected (see FIG. 7), characteristics of the semiconductor device 10 as the MOSFET are maintained as they are.

Alternatively, as described in the first embodiment, an interval of the body contact areas C in the section A3, which is inferior in heat dissipating property, may be made smaller than an interval of the body contact areas C in the other section A2 (see FIG. 3). Alternatively, the concentration of p-type impurities of the body region 36 at portions thereof located below the body contact areas C in the section A3, which is inferior in heat dissipating property, may be made smaller than the concentration of p-type impurities of the body region 36 at portions thereof located below the body contact areas C in the other section 4. Alternatively, a density of the crystal defects 12d at portions located below the body contact areas C in the section A3, which is inferior in heat dissipating property, may be made greater than a density of the crystal defects 12d at portions located below the body contact areas C in the other section A4. These structural examples can be adopted solely, or two or more of them can be adopted in arbitrary combinations.

Figure 9:
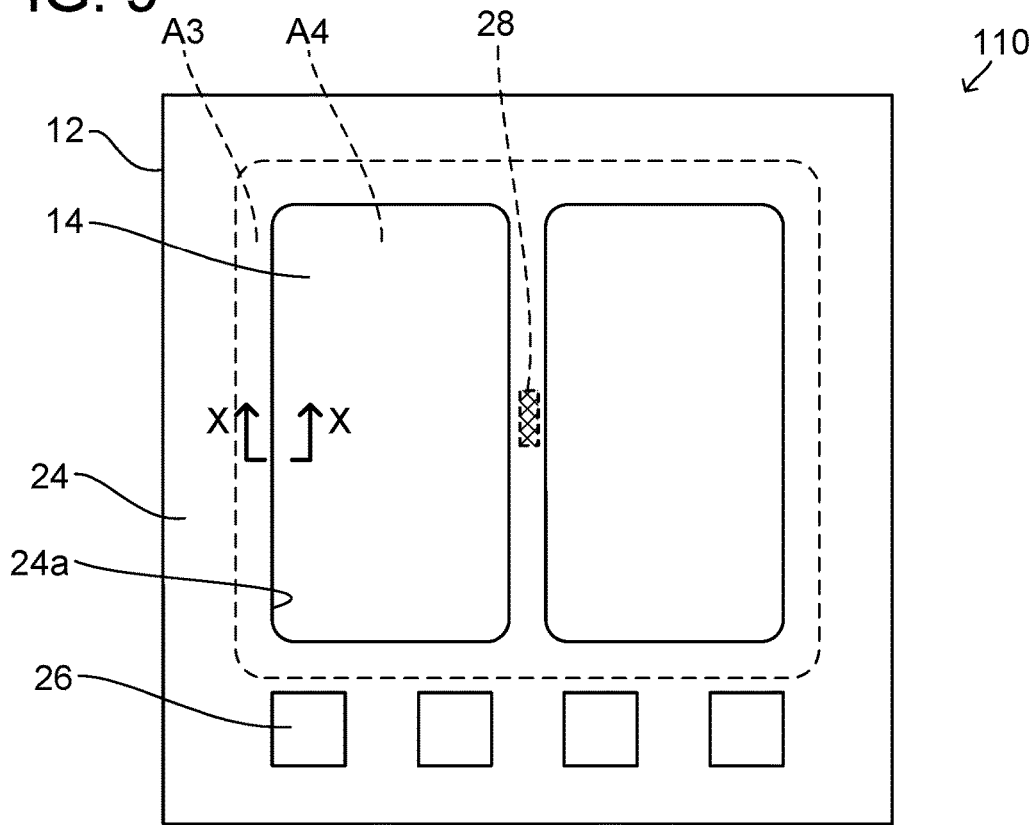
FIG. 9 is a planar view of a semiconductor device 110 in a third embodiment.
Figure 10:
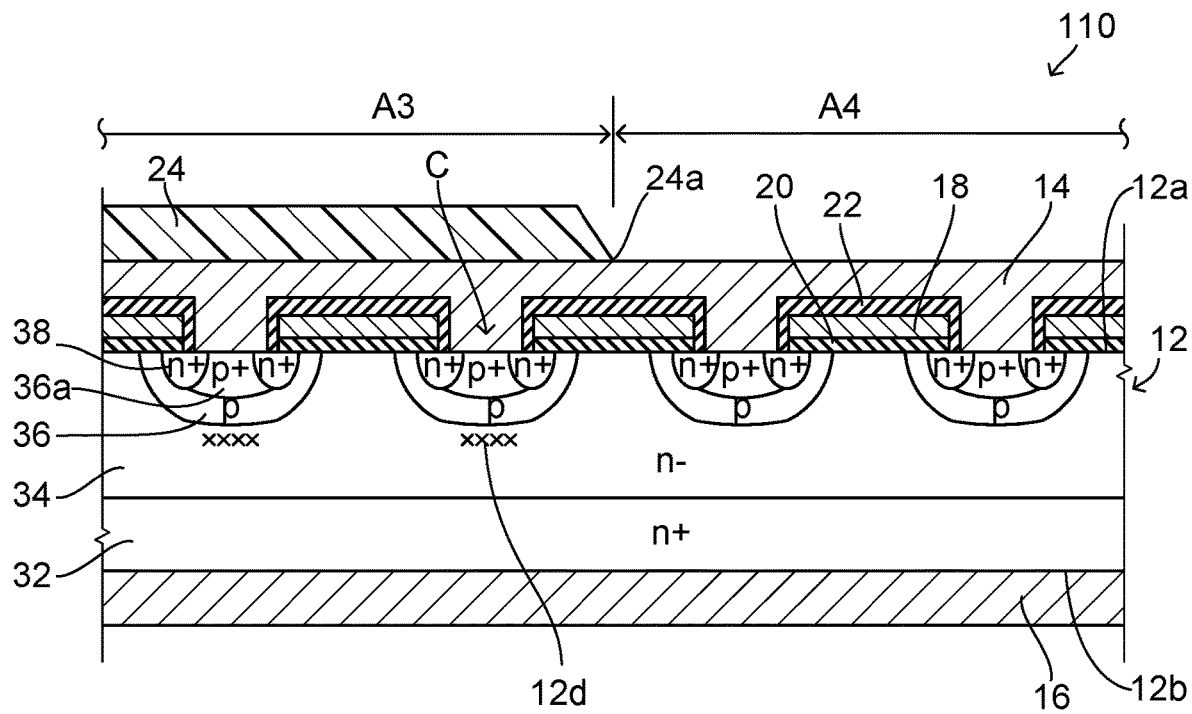
FIG. 10 is a cross-sectional view taken along a line X-X in FIG. 9, and schematically illustrates a cross-sectional structure of the semiconductor device 110.

(Third Embodiment) Next, with reference to FIGS. 9 and 10, a semiconductor device 110 in a third embodiment will be described. Configurations that are common with or correspond to configurations in the first and second embodiments are denoted with the same signs, and overlapping descriptions for them are omitted here. As shown in FIGS. 9 and 10, the semiconductor device 110 in the present embodiment includes a planar gate structure and is different, in this regard, from the semiconductor devices 10, 10a, 10b, and 100 in the first and second embodiments 1, each including a trench gate structure. In other words, in the semiconductor device 110, the gate electrodes 18 and the gate insulating films 20 are provided along the upper surface 12a of the semiconductor substrate 12, and the gate electrodes 18 are opposed to the upper surface 12a of the semiconductor substrate 12 with the gate insulating films 20 interposed therebetween.

As shown in FIG. 10, the semiconductor substrate 12 includes a MOSFET structure that includes the drain region 32, the drift region 34, the body regions 36, and the source regions 38. In comparison with the structures described in the first and second embodiments, the structures of the body regions 36 (which include the body contact regions 36a) and the source regions 38 are changed. The gate electrodes 18 are opposed to the source regions 38, the body regions 36, and the drift region 34 with the gate insulating films 20 interposed therebetween. Moreover, the source regions 38 and the body regions 36 are in ohmic contact with the upper electrode 14. As understood by those skilled in the art, the MOSFET structure in the present embodiment includes a body diode that can be utilized as a freewheeling diode, same as in the MOSFET structures described in the first and second embodiments.

As in the second embodiment, in the semiconductor device 110 in the present embodiment, the MOSFET structure in the section A3 covered by the protective film 24 and the MOSFET structure in the section A4 that is not covered by the protective film 24 are different from each other. Specifically, a density of the crystal defects 12d at portions located below the body contact areas C in the section A3, which is inferior in heat dissipating property, is greater than that in the other section A4. Thereby, a forward voltage drop of the body diode in the section A3 with respect to a current density becomes higher than a forward voltage drop of the body diode in the section A4 with respect to the same current density, and when a current flows in the body diodes in the semiconductor substrate 12, a current density in the section A3 becomes smaller than a current density in the section A4. As in the second embodiment, an amount of heat generated in the semiconductor substrate 12 is reduced in the section A3, which is inferior in heat dissipating property, and hence the temperature distribution in the semiconductor substrate 12 is improved.

As is understood from the second and third embodiments, the technology disclosed herein can be adopted to both of a trench gate-type MOSFET structure and a planar gate-type MOSFET structure. Additionally, the technology disclosed herein is not limited to a specific MOSFET structure, and can be adopted to various MOSFET structures. In this case, the MOSFET structure may include the n-type source region 38 being in contact with the upper electrode 14, the n-type drain region 32 being in contact with the lower electrode 16, the p-type body region 36 intervening between the source region 38 and the drain region 32 and being in contact with the upper electrode 14, and the n-type drift region 34 intervening between the body region 36 and the drain region 32. Since both of the drain region 32 and the drift region 34 are n-type semiconductor regions, a distinct border is not required between them.

Figure 11:
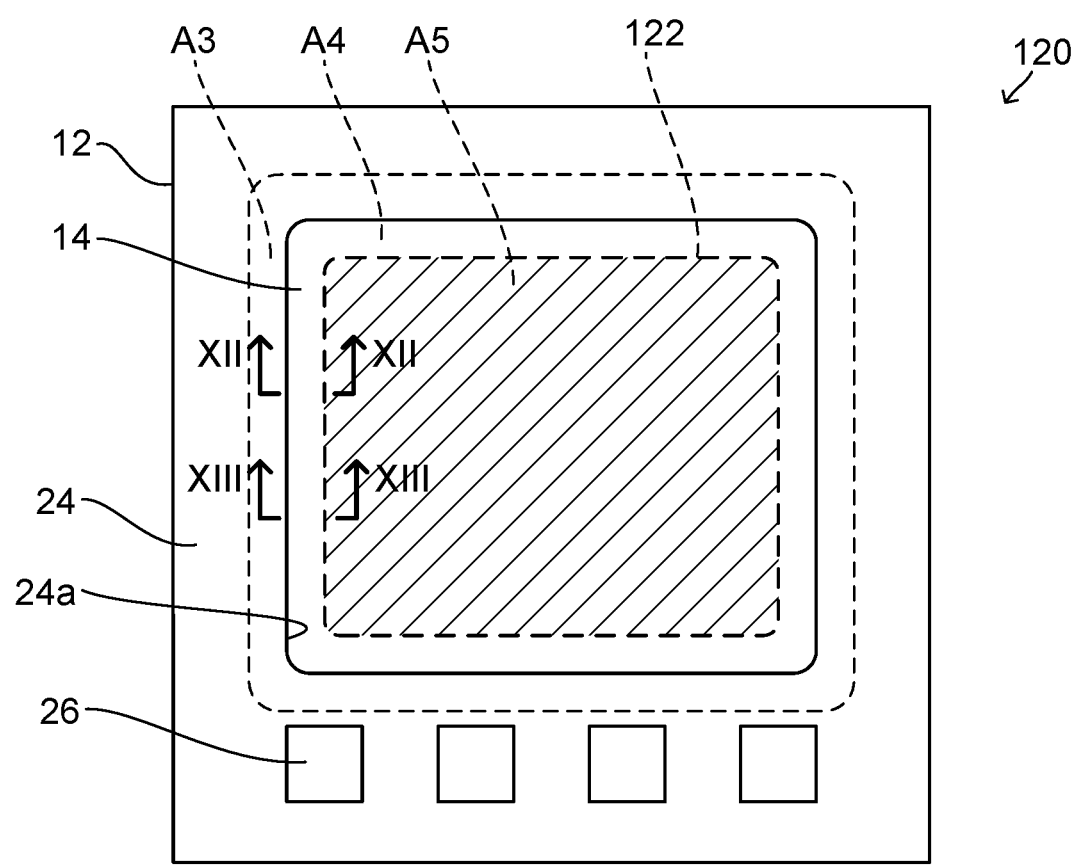
FIG. 11 is a planar view of a semiconductor device 120 in a fourth embodiment.
Figure 12:
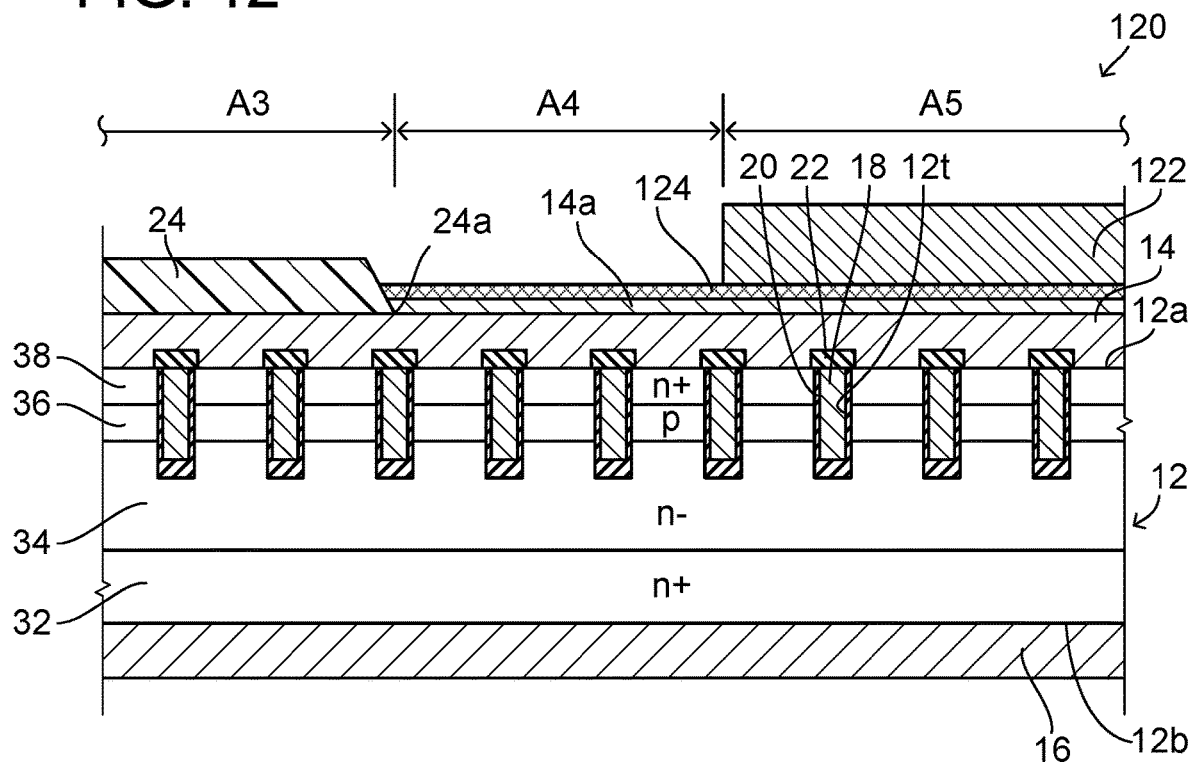
FIG. 12 is a cross-sectional view taken along a line XII-XII in FIG. 11, and schematically illustrates a cross-sectional structure of the semiconductor device 120 along the source regions 38.

(Fourth Embodiment) Next, with reference to FIGS. 11 to 13, a semiconductor device 120 in a fourth embodiment will be described. Configurations that are common with or correspond to configurations in the first to third embodiments are denoted with the same signs, and overlapping descriptions for them are omitted here. The semiconductor device 120 in the present embodiment includes a trench gate structure, as in the first and second embodiments. The semiconductor device 120 is usually incorporated into a semiconductor package, along with a conductive member 122 such as a lead. At this time, the conductive member 122 is joined with at least a part of the upper electrode 14 of the semiconductor device 120 via a solder layer 124, for example. Accordingly, to enhance affinity and bonding performance with the solder layer 124, the upper electrode 14 may include a plated layer 14a constituted of, for example, nickel or gold.

With the conductive member 122 joined with the upper electrode 14, the semiconductor substrate 12 includes, in a planar view, a section A5 covered by the conductive member 122, and sections A3 and A4 that are not covered by the conductive member 122. Heat in the semiconductor substrate 12 can be dissipated to outside through the conductive member 122. Accordingly, the sections A3 and A4, which are not covered by the conductive member 122, are inferior in heat dissipating property to the section A5 covered by the conductive member 122, and thus a temperature of each of the sections A3 and A4 tends to become high. Therefore, in the semiconductor device 120 in the present embodiment, the MOSFET structure in each of the sections A3 and A4 that are not covered by the conductive member 122 and the MOSFET structure in the section A5 covered by the conductive member 122 are different from each other. Furthermore, in the semiconductor device 120 in the present embodiment, the MOSFET structure in the section A3 covered by the protective film 24 and the MOSFET structure in the section A4 that is not covered by the protective film 24 are also different from each other. In other words, the MOSFET structures in the three sections A1 to A3 that have different degrees of heat dissipating property are different from one another.

Figure 13:
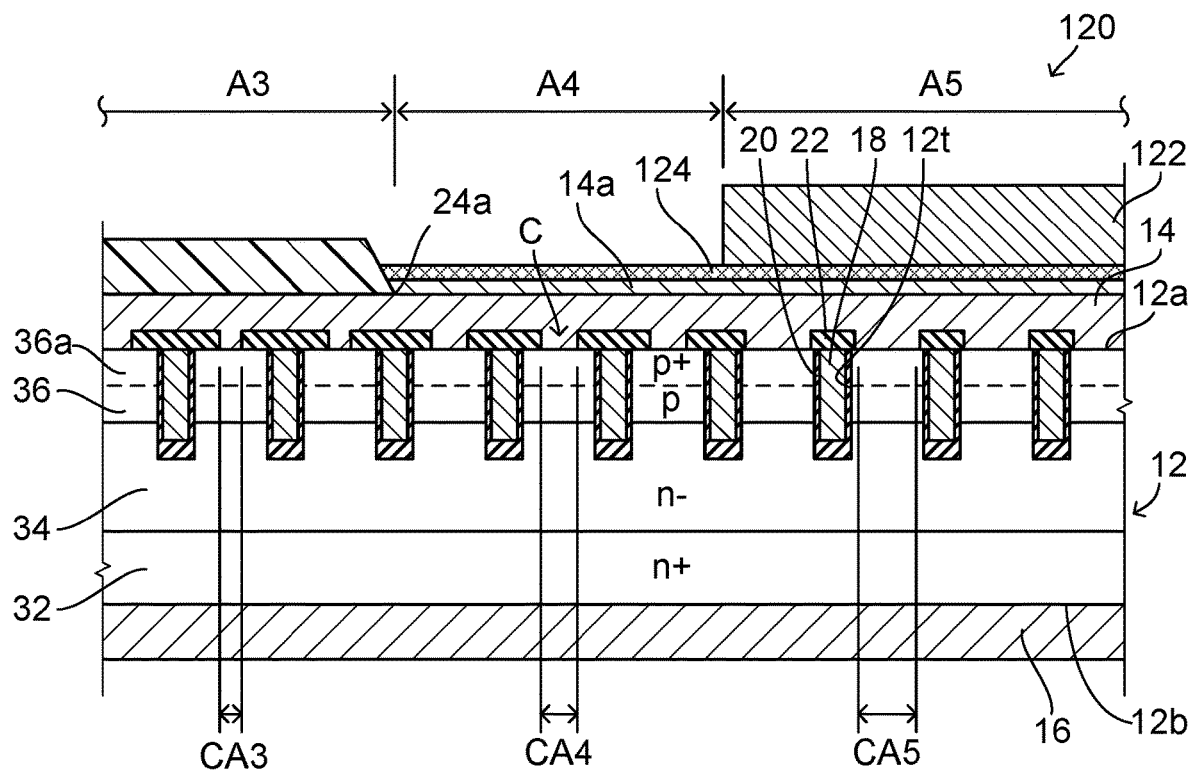

As shown in FIG. 13, the two sections A3 to A5 each include a plurality of the body contact areas C where the body region 36 is in contact with the upper electrode 14. When the three sections A3 to A5 are compared, the section A3 covered by the protective film 24 is the most inferior in heat dissipating property, and the section A5 covered by the conductive member 122 is the most superior in heat dissipating property. Accordingly, sizes CA3 to CA5 of each body contact area C respectively in the sections A3 to A5 satisfy a relation of CA3<CA4<CA5. The forward voltage drop of the body diode with respect to a current density is thereby the highest in the section A3 and is the lowest in the section A5. Accordingly, when a current flows in the body diodes in the semiconductor substrate 12, a current density becomes the smallest in the section A3 and becomes the greatest in the section A5. Since amounts of heat generated in the sections A3 to A5 are adjusted in accordance with their degrees of heat dissipating property, the temperature distribution in the semiconductor substrate 12 is improved.

In another embodiment, the MOSFET structures may be made different from one another among four or more sections such that the forward voltage drops of the body diodes with respect to a current density are different from one another in these sections. In this case, as in the first to third embodiments, a means for differentiating the forward voltage drops of the body diodes in the sections from one another is not limited to a specific means, and one or a plurality of the structural examples described herein can be adopted.

In the semiconductor devices 10, 10a, 10b, 100, 110, and 120 disclosed herein, the temperature distribution attributed to heat generation by the body diode included in the MOSFET structure is improved. Accordingly, when any of these semiconductor devices 10, 10a, 10b, 100, 110, and 120 is adopted to a converter or an inverter, the body diode can be utilized as a freewheeling diode. Here, each of the semiconductor devices 10, 10a, 10b, 100, 110, and 120 can also be adopted suitably to a converter or an inverter in which synchronous rectification control is performed. The synchronous rectification control refers to control that drives the gate electrodes 18 (i.e., turns on the MOSFET) in accordance with a time period during which a current flows in the body diode, to restrict the current that flows in the body diode.

The invention claimed is:
1. A semiconductor device comprising:
an upper electrode;
a lower electrode; and
a semiconductor substrate comprising:
    an upper surface on which the upper electrode is disposed;
    a lower surface on which the lower electrode is disposed;
    in a planar view, a first section including a center of the semiconductor substrate;
    in the planar view, a second section located between the first section and a peripheral edge of the semiconductor substrate;
    a first MOSFET structure in the first section and having a first body diode; and
    a second MOSFET structure in the second section and having a second body diode, the first MOSFET structure and the second MOSFET structure being different from each other such that a forward voltage drop of the first body diode with respect to a current density is higher than a forward voltage drop of the second body diode with respect to the current density, each of the first and second MOSFET structures comprising:
        an n-type source region in contact with the upper electrode;
        an n-type drain region in contact with the lower electrode;
        a p-type body region intervening between the source region and the drain region and in contact with the upper electrode; and
        an n-type drift region intervening between the body region and the drain region,
    wherein an occupancy of a contact area where the body region is in contact with the upper electrode in the first section is smaller than an occupancy of a contact area where the body region is in contact with the upper electrode in the second section.
2. The semiconductor device according to claim 1, wherein
the first section and the second section each include a plurality of contact areas where the body region is in contact with the upper electrode, and an interval of the contact areas in the first section is greater than an interval of the contact areas in the second section.

3. The semiconductor device according to claim 1, wherein
the first section and the second section each include a plurality of contact areas where the body region is in contact with the upper electrode, and
a size of each contact area in the first section is smaller than a size of each contact area in the second section.

4. The semiconductor device according to claim 1, wherein
a concentration of p-type impurities of the body region at a portion located below a contact area where the body region is in contact with the upper electrode in the first section is smaller than a concentration of p-type impurities of the body region at a portion located below a contact area where the body region is in contact with the upper electrode in the second section.

5. The semiconductor device according to claim 1, wherein
a density of crystal defects at a portion located below a contact area where the body region is in contact with the upper electrode in the first section is greater than a density of crystal defects at a portion located below a contact area where the body region is in contact with the upper electrode in the second section.

6. The semiconductor device according to claim 5, wherein
a density of crystal defects at a portion of the drift region located below the contact area in the first section is greater than a density of crystal defects at a portion of the drift region located below the contact area in the second section.

7. The semiconductor device according to claim 1, further comprises
a temperature sensor configured to measure a temperature of the semiconductor substrate,
wherein the temperature sensor is located at or close to the center of the semiconductor substrate.

8. A semiconductor device comprising:
an upper electrode;
an insulating protective film covering a part of the upper electrode;
a lower electrode; and
a semiconductor substrate comprising:
an upper surface on which the upper electrode is disposed;
a lower surface on which the lower electrode is disposed;
in a planar view, a first section covered by the protective film;
in the planar view, a second section which is not covered by the protective film;
a first MOSFET structure in the first section and having a first body diode that is configured to allow a first current to flow from the upper electrode to the lower electrode; and
a second MOSFET structure in the second section and having a second body diode that is configured to allow a second current to flow from the upper electrode to the lower electrode, the first MOSFET structure and the second MOSFET structure being different from each other such that a forward voltage drop of the first body diode with respect to a current density is higher than a forward voltage drop of the second body diode with respect to the current density.

9. The semiconductor device according to claim 8, wherein each of the first and second MOSFET structures comprises:
an n-type source region in contact with the upper electrode,
an n-type drain region in contact with the lower electrode,
a p-type body region intervening between the source region and the drain region and in contact with the upper electrode, and
an n-type drift region intervening between the body region and the drain region.

10. The semiconductor device according to claim 9, wherein
an occupancy of a contact area where the body region is in contact with the upper electrode in the first section is smaller than an occupancy of a contact area where the body region is in contact with the upper electrode in the second section.

11. The semiconductor device according to claim 9, wherein
the first section and the second section each include a plurality of contact areas where the body region is in contact with the upper electrode, and
an interval of the contact areas in the first section is greater than an interval of the contact areas in the second section.

12. The semiconductor device according to claim 9, wherein
the first section and the second section each include a plurality of contact areas where the body region is in contact with the upper electrode, and
a size of each contact area in the first section is smaller than a size of each contact area in the second section.

13. The semiconductor device according to claim 9, wherein
a concentration of p-type impurities of the body region at a portion located below a contact area where the body region is in contact with the upper electrode in the first section is smaller than a concentration of p-type impurities of the body region at a portion located below a contact area where the body region is in contact with the upper electrode in the second section.

14. The semiconductor device according to claim 9, wherein
a density of crystal defects at a portion located below a contact area where the body region is in contact with the upper electrode in the first section is greater than a density of crystal defects at a portion located below a contact area where the body region is in contact with the upper electrode in the second section.

15. The semiconductor device according to claim 14, wherein
a density of crystal defects at a portion of the drift region located below the contact area in the first section is greater than a density of crystal defects at a portion of the drift region located below the contact area in the second section.

16. The semiconductor device according to claim 8, further comprises
a temperature sensor configured to measure a temperature of the semiconductor substrate,
wherein the temperature sensor is located at or close to a center of the semiconductor substrate.

17. A semiconductor device comprising:
- an upper electrode, at least a part of an upper surface of the upper electrode being configured to be joined with a conductive member;
- a lower electrode; and
- a semiconductor substrate comprising:
  - an upper surface on which the upper electrode is disposed;
  - a lower surface on which the lower electrode is disposed;
  - in a planar view, a first section which is not covered by the conductive member:
  - in the planar view, a second section covered by the conductive member;
  - a first MOSFET structure in the first section and having a first body diode that is configured to allow a first current to flow from the upper electrode to the lower electrode; and
  - a second MOSFET structure in the second section and having a second body diode that is configured to allow a second current to flow from the upper electrode to the lower electrode, the first MOSFET structure and the second MOSFET structure being different from each other such that a forward voltage drop of the first body diode with respect to a current density is higher than a forward voltage drop of the second body diode with respect to the current density.

18. The semiconductor device according to claim 17, wherein each of the MOSFET structures comprises:
- an n-type source region in contact with the upper electrode,
- an n-type drain region in contact with the lower electrode,
- a p-type body region intervening between the source region and the drain region and in contact with the upper electrode, and
- an n-type drift region intervening between the body region and the drain region.

19. The semiconductor device according to claim 18, wherein
- an occupancy of a contact area where the body region is in contact with the upper electrode in the first section is smaller than an occupancy of a contact area where the body region is in contact with the upper electrode in the second section.

20. The semiconductor device according to claim 18, wherein
- the first section and the second section each include a plurality of contact areas where the body region is in contact with the upper electrode, and
- an interval of the contact areas in the first section is greater than an interval of the contact areas in the second section.

21. The semiconductor device according to claim 18, wherein
- the first section and the second section each include a plurality of contact areas where the body region is in contact with the upper electrode, and
- a size of each contact area in the first section is smaller than a size of each contact area in the second section.

22. The semiconductor device according to claim 18, wherein
- a concentration of p-type impurities of the body region at a portion located below a contact area where the body region is in contact with the upper electrode in the first section is smaller than a concentration of p-type impurities of the body region at a portion located below a contact area where the body region is in contact with the upper electrode in the second section.

23. The semiconductor device according to claim 18, wherein
- a density of crystal defects at a portion located below a contact area where the body region is in contact with the upper electrode in the first section is greater than a density of crystal defects at a portion located below a contact area where the body region is in contact with the upper electrode in the second section.

24. The semiconductor device according to claim 23, wherein
- a density of crystal defects at a portion of the drift region located below the contact area in the first section is greater than a density of crystal defects at a portion of the drift region located below the contact area in the second section.

25. The semiconductor device according to claim 17, further comprises
- a temperature sensor configured to measure a temperature of the semiconductor substrate,
- wherein the temperature sensor is located at or close to a center of the semiconductor substrate.

\* \* \* \* \*